(12) United States Patent
Liao

(10) Patent No.: US 7,682,160 B2
(45) Date of Patent: Mar. 23, 2010

(54) LAND GRID ARRAY CONNECTOR WITH INTERLEAVED BASES ATTACHED TO RETENTION FRAME

(75) Inventor: Fang-Jun Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 221 days.

(21) Appl. No.: 12/005,203

(22) Filed: Dec. 26, 2007

(65) Prior Publication Data
US 2008/0153322 A1    Jun. 26, 2008

(30) Foreign Application Priority Data
Dec. 26, 2006   (CN) .................... 2006 2 0152311

(51) Int. Cl.
*H01R 12/00* (2006.01)
(52) U.S. Cl. ..................................... 439/71
(58) Field of Classification Search .............. 439/70, 439/71, 717
See application file for complete search history.

(56) References Cited

U.S. PATENT DOCUMENTS

| | | | |
|---|---|---|---|
| 6,315,621 B1 * | 11/2001 | Natori et al. ............. | 439/862 |
| 6,442,045 B1 * | 8/2002 | Goodwin et al. ........... | 361/816 |
| 6,679,707 B1 | 1/2004 | Brodsky et al. | |
| 6,881,073 B2 * | 4/2005 | Bali et al. .................. | 439/70 |
| 6,916,195 B2 | 7/2005 | Byquist | |
| 6,929,505 B2 * | 8/2005 | He et al. .................... | 439/526 |

* cited by examiner

*Primary Examiner*—Phuong K Dinh
(74) *Attorney, Agent, or Firm*—Andrew C. Cheng; Wei Te Chung; Ming Chieh Chang

(57) ABSTRACT

A Land Grid Array connector (1) comprises an socket (2) having opposite upper and lower surfaces, a plurality of contacts (4) received in the socket and a retention frame (3) assembled with the socket. Each contact comprises upper and lower contacting sections (41, 42) extending beyond the upper and lower surfaces of the socket adapted for electrically connecting with a Central Processing Unit and Printed Circuit Board. The retention frame comprises a base portion (31) defining an opening to interferentially receive the outer periphery of the socket and four sidewalls (32) extending upwardly beyond the base portion. The socket fills up the opening after assembled to the retention frame and forms a receiving space together with the base portion and the four sidewalls of the retention frame which is originally communicating with the opening before the socket is assembled to the retention frame adapted for accommodating the Central Processing Unit.

7 Claims, 5 Drawing Sheets

LAND GRID ARRAY CONNECTOR WITH INTERLEAVED BASES ATTACHED TO RETENTION FRAME

BACKGROUND OF THE INVENTION

1. Field of the Invention

The present invention generally relates to a Land Grid Array connector assembly, and more particularly to a Land Grid Array (LGA) Land Grid Array connector for removably mounting a chip module, such as a Central Processing Unit (CPU), to a printed circuit board.

2. Description of Related Art

U.S. Pat. No. 6,929,505, issued on Aug. 16, 2005 and assigned to HonHai, discloses a Land Grid Array (LGA) connector for electrically connecting a chip module to a printed circuit board (PCB). Such LGA connector comprises an insulative housing, a plurality of contacts received in the insulative housing, and a mating frame surrounding the insulative housing and integrally formed with the insulative housing. The LGA connector is disposed on the PCB to realize the electrical connection between the contacts and the PCB. Then the chip module is displaced on upper surface of the insulative housing to realize the electrical connection between the chip module and the contacts, further realize the electrical connection between the chip module and the PCB.

However, with the increase of the number of the pins of the chip module and function added to the chip module, the number of contacts received in the insulative housing is also increased, correspondingly, of course, the square of the insulative housing is increased either. This causes the intensity of the integral insulative housing is not rigid enough to support so many contacts and increases the difficulty to mold such insulative housing or causes the insulative housing to be prone to deformation.

Therefore, it is desired to provide an improved Land Grid Array connector assembly to stress the problems mentioned above.

BRIEF SUMMARY OF THE INVENTION

Accordingly, an object of the present invention is to provide a Land Grid Array connector with improved housing structure with enough rigidity and easy to be molded.

In order to achieve the above-mentioned object, a Land Grid Array connector comprises an socket having opposite upper and lower surfaces, a plurality of contacts received in the socket and a frame assembled with the socket. Each contact comprises upper and lower contacting sections extending beyond the upper and lower surfaces of the socket adapted for electrically connecting with a Central Processing Unit and Printed Circuit Board. The retention frame comprises a base portion defining an opening to receive the outer periphery of the socket and four sidewalls extending upwardly beyond the base portion. The socket fills up the opening after assembled to the retention frame and forms a receiving space together with the base portion and the four sidewalls of the retention frame which is originally communicating with the opening before the socket is assembled to the retention frame adapted for accommodating the Central Processing Unit.

Other objects, advantages and novel features of the invention will become more apparent from the following detailed description of the present embodiment when taken in conjunction with the accompanying drawings.

DETAILED DESCRIPTION OF THE INVENTION

Figure 1:
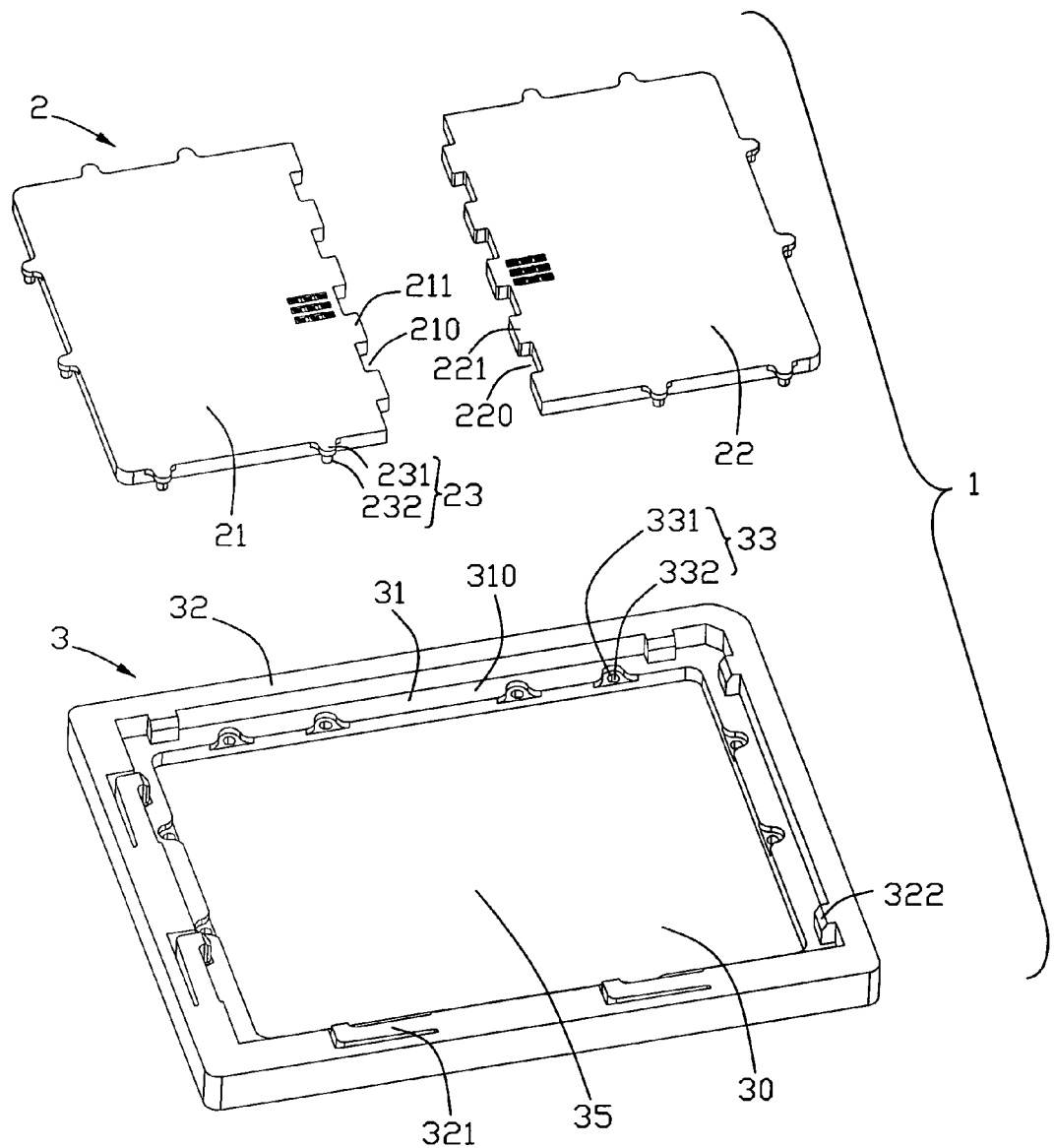
FIG. 1 is an exploded, perspective view of a Land Grid Array connector in accordance with the preferred embodiment of the present invention.

Reference will now be made to the drawing figures to describe the present invention in detail.

Figure 2:
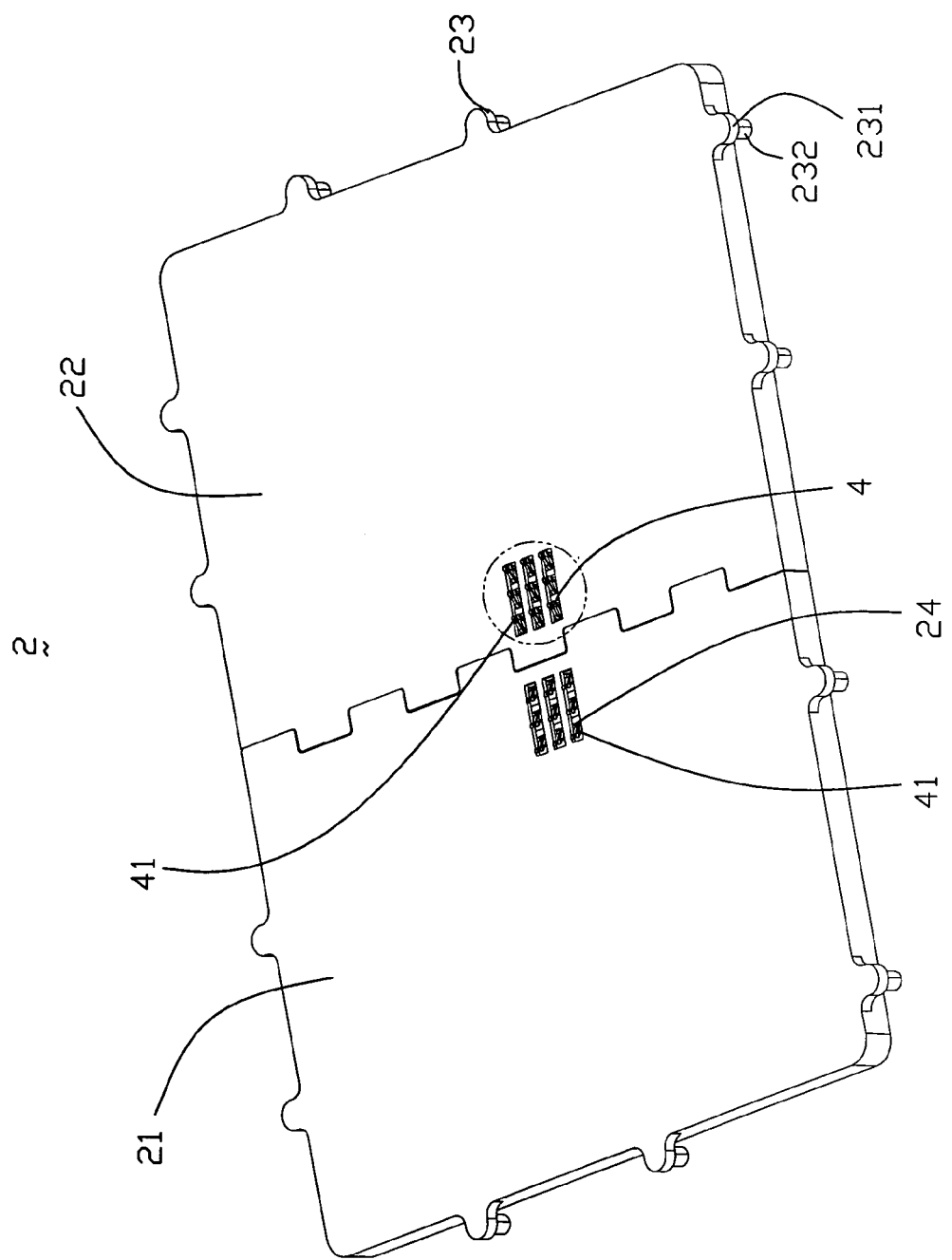
FIG. 2 is a partially assembled view of FIG. 1.
Figure 3:
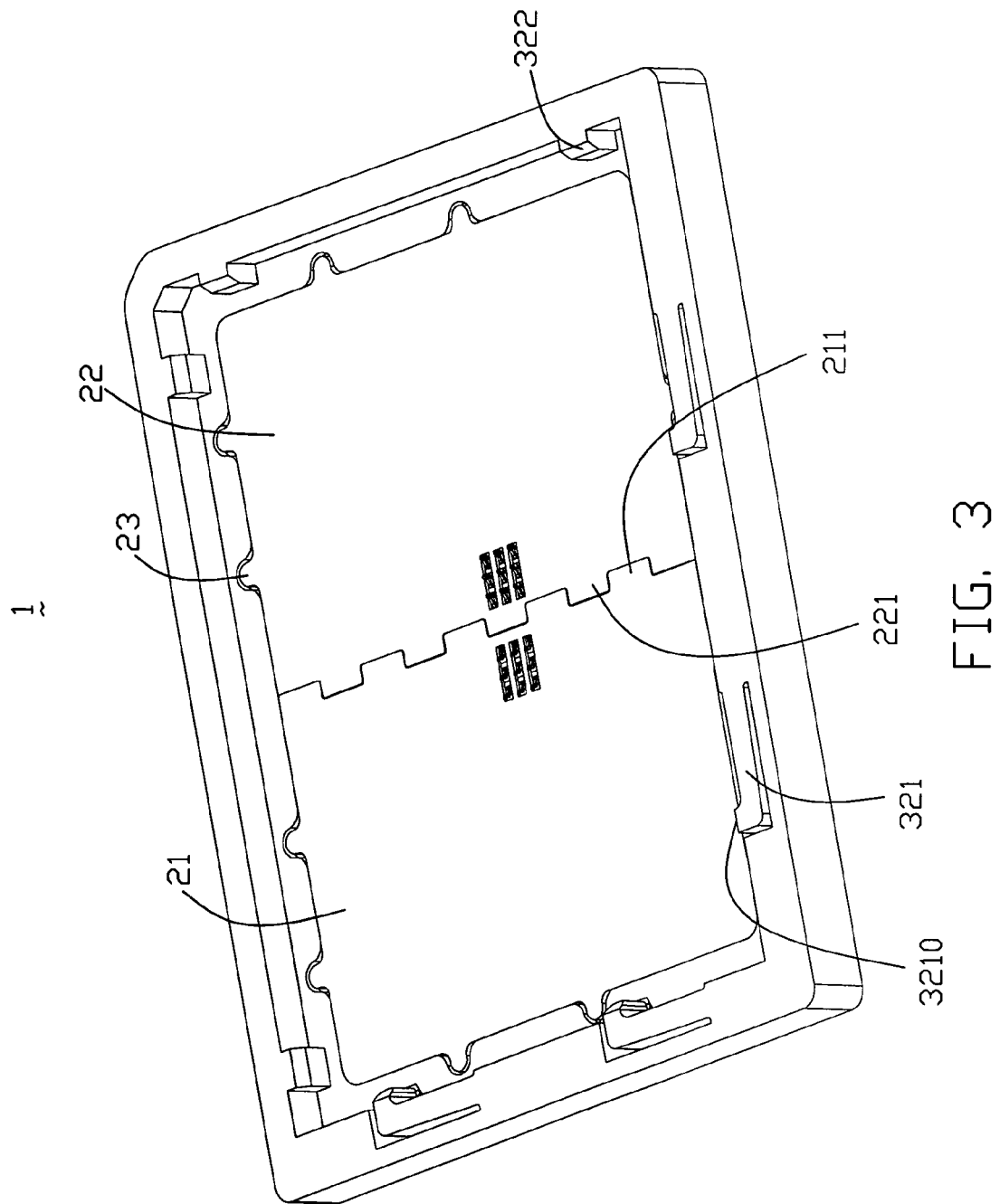
FIG. 3 is an assembled, perspective view of the Land Grid Array connector assembly of FIG. 1.
Figure 4:
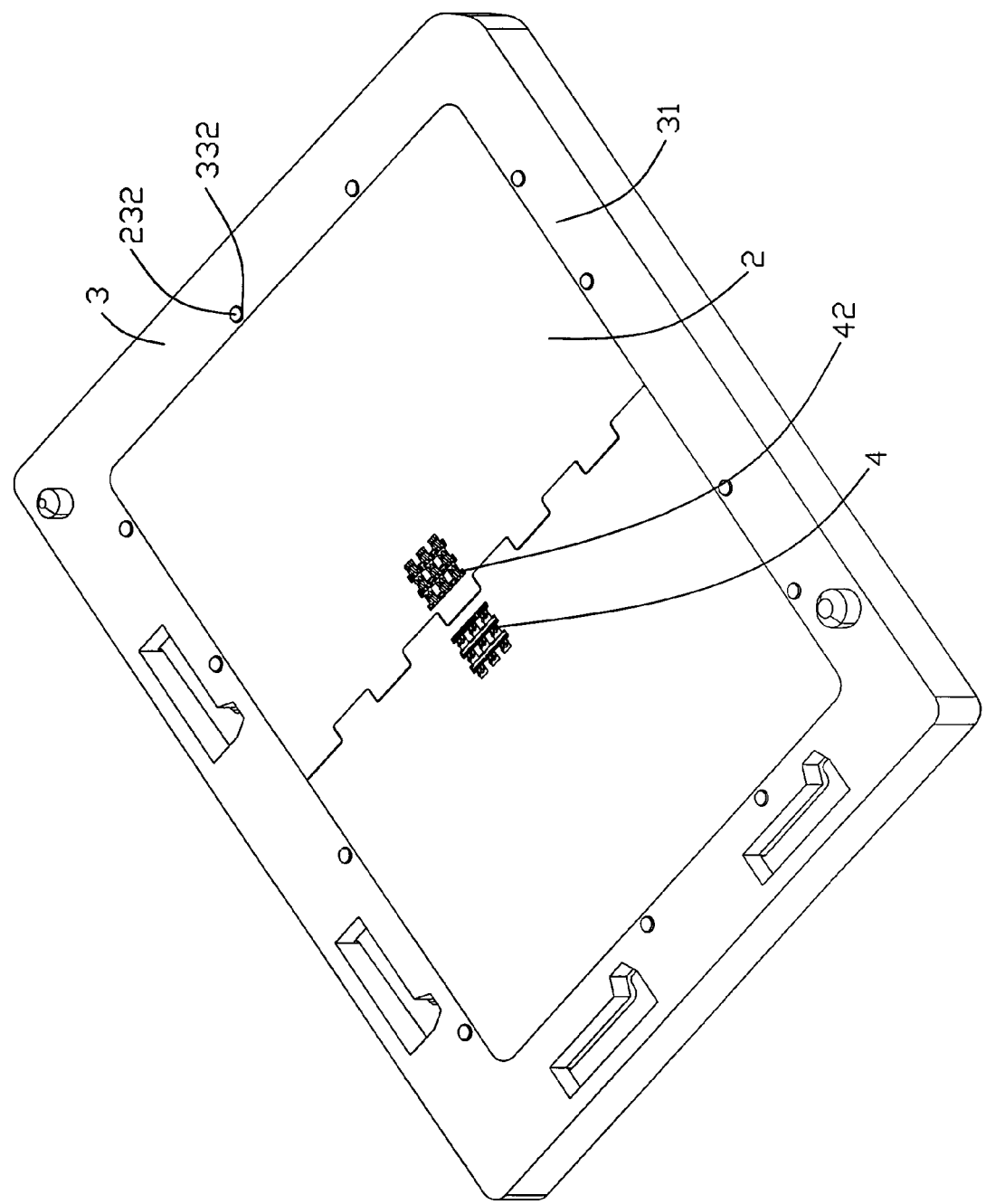
FIG. 4 is a view similar to FIG. 3, but viewed from another aspect.
Figure 5:
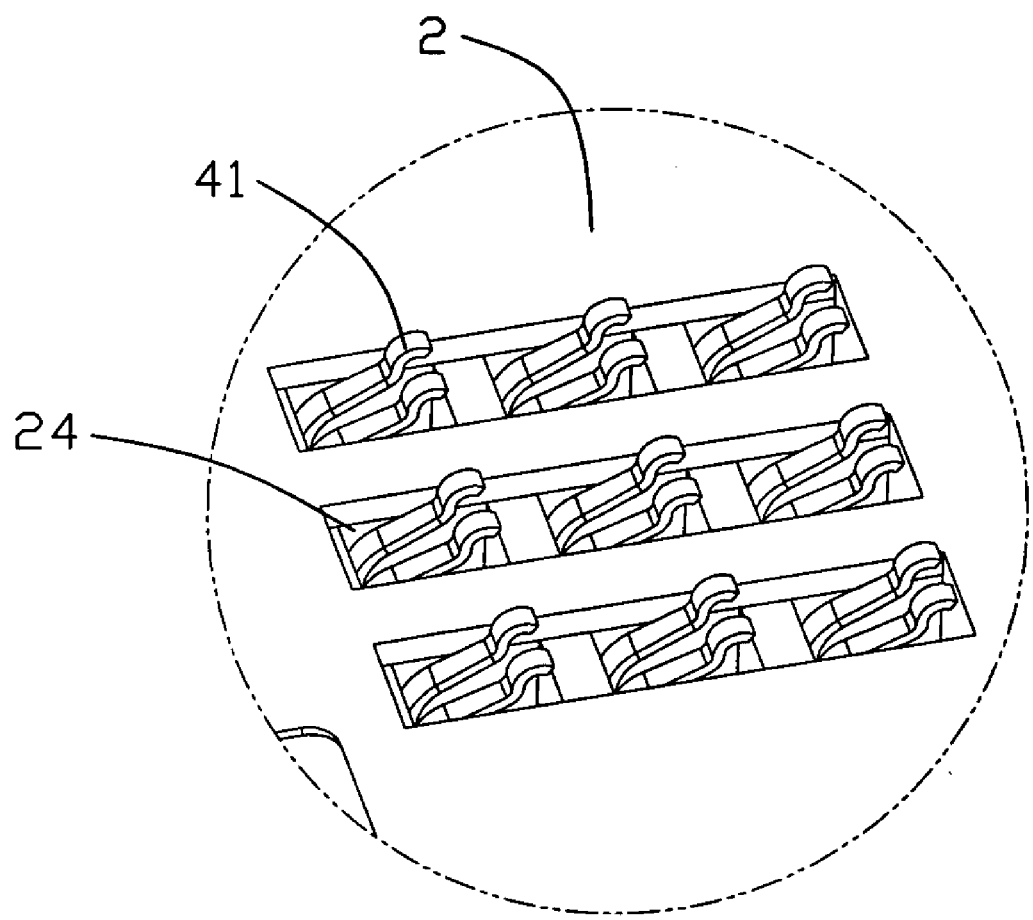
FIG. 5 is an enlarged view of a circled section shown in FIG. 2.

Please refer to FIGS. 1-5, a Land Grid Array connector 1 in accordance with the preferred embodiment of the present invention is for electrically connecting a chip module (not shown), such as a Central Processing Unit (CPU), with a printed circuit board (PCB, not shown). In the preferred embodiment of the present invention, the Land Grid Array connector 1 is a Land Grid Array (LGA) type connector whose contacts having upper and lower elastic contacting sections exposed beyond upper and lower surfaces of socket for elastically engaging with the CPU and the PCB. The Land Grid Array connector 1 comprises a socket 2, a plurality of contacts 4 accommodated in the socket 2, and a retention frame 3 surrounding the socket 2.

The socket 2 is a substantially flat board with a certain thickness along vertical direction and comprises a first socket unit 21 and a second socket unit 22 combinable with the first socket unit 21. The first socket unit 21 forms a plurality of first protruding sections 211 extending flatly and outwardly from one edge thereof toward the second socket unit 22 and a plurality of first aligning slots 210 between adjacent two first protruding sections 211. The second socket unit 22 forms a plurality of second protruding sections 221 aligning with the first aligning slots 210 and capable of engagingly received in the first aligning slots 210 and a plurality of second aligning slots 220 aligning with the first protruding sections 211 and capable of engagingly receiving the first protruding sections 211. Thus, the first and second socket units 21, 22 are combined with each other to form the socket 2. The other three edges of the socket unit 21, 22 forms a plurality of positioning sections 23 depending downwardly therefrom. In the preferred embodiment, each edge of the socket unit 21, 22 is arranged with a pair of positioning sections 23 integrally and spaced arranged therewith. In an alternative embodiment, the positioning sections 23 also can be changed in numbers and positions and can be separate members assembled to the edges of the socket units 21, 22. Each positioning section 23 comprises a top planar body section 231 with top surface coplanar with that of the socket unit 21, 22 and a column-shape post 232 depending downwardly from the body section 231. Each of the first and second socket units 21, 22 defines a plurality of contact-receiving passages 24 arranged in matrix and penetrating through upper and lower surfaces of the socket units 21, 22.

Each contact 4 comprises upper and lower contacting sections 41, 42 respectively exposed beyond the upper and lower surfaces of the socket 2 and a middle retention section (not labeled) interferentially received in the contact-receiving passages 24 to retain the contact 4 in the socket 2. The upper and lower contacting sections 41, 42 are respectively elastically compressed by the CPU and the PCB to form electrical connection between the CPU and the PCB. Further, the contacting sections 41, 42 of the contacts 4 received in the first socket unit 21 face to the contacting sections 41, 42 of the contacts 4 received in the second socket unit 22. That is to say, the extending direction of the contacting sections 41, 42 received in the first socket unit 21 is opposite to that of the contacting sections 41, 42 received in the second socket unit 22. Each contacting section 41, 42 is a dual-beam structure which increases contacting reliability.

The retention frame 3 is substantially rectangular and comprises a bottom base portion 31 and four sidewalls 32 extending upwardly from four edges of the base portion 31. A middle region of the base portion 31 is partially cut to form an opening 30 with a height substantially equal to that of the socket 2. Thus, the base portion 31 forms four flat edges 310 adjacent to and connecting with corresponding sidewalls 32. A receiving space 35 defined by four sidewalls 32 communicates with the opening 34 for receiving the CPU. Two adjacent sidewalls 32 of the retention frame 3 form two pairs of spring arms 321 split therefrom and each spring arm 321 forms a protruding head section 3210 protruding into the receiving space 35 from free end of the spring arm 321 for elastically abutting against the CPU. While, the other two sidewalls 32 form two pairs of projections 322 formed with a flat surface facing to the receiving space 34 to serve as datum for the position of the CPU. The four edges 310 of the base portion 31 consist of a pair of opposite long edges and a pair of opposite short edges. Each long edge of the base portion 31 is partially cutout to form four cutouts 331 opening toward the receiving space 35 and the opening 30 corresponding to the body sections 231 of the socket units 21, 22. Each short edge of the base portion 31 is partially cutout to form a pair of cutouts 331 corresponding to the body sections 231 of the socket units 21, 22. A circular positioning hole 332 is defined through the edges 310 and locates in each cutout 331.

In assembly, the combined socket 2 together with the assembled contacts 4 is assembled to the retention frame 3 with the socket 2 is put into the receiving space 35 with the posts 232 of the positioning sections 23 of the socket 2 aligning with the positioning holes 332 of the retention frame 3. Then, the socket 2 is pressed downwardly to be received in the opening 30 with the posts 232 pressed into the positioning holes 332 of the retention frame 3 and the body sections 231 of the socket 2 received into the cutouts 331 of the retention frame 3. Now, the upper and lower surfaces of the socket 2 are coplanar with upper and lower surfaces of the edges 310 of the base portion 31 and the top surfaces of the body sections 231 are coplanar with the of the upper surfaces of the edges 310. Finally, the posts 232 protruding beyond the lower surface of the base portion 31 are compressed by outer tool to form enlarged sections (not shown) with a diameter larger than that of the positioning holes 332 for preventing the socket 2 from separating from the retention frame 3. The upper and lower contacting sections 41, 42 of the contacts 4 are respectively exposed into the receiving space 35 and beyond the lower surface of the base portion 31 along opposite directions for being elastically compressed by the CPU and the PCB.

In the preferred embodiment, the two-part socket 2 decreases the manufacture difficulty. Of course, the socket 2 can comprise a plurality of socket units more than two. In the preferred embodiment, the socket 2 is assembled to the retention frame 3 by the alignment and engagement between posts 232 of the housing 2 and the positioning holes 332 of the retention frame 3. However, in an alternative embodiment, the posts can be disposed on the retention frame 3, and the socket 2 defines positioning holes. In summary, the positioning sections 23 of the socket 2 is the first positioning means of the Land Grid Array connector 1, and the positioning holes 332 and the cutouts 331 form the second positioning means 33 of the Land Grid Array connector 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A Land Grid Array Connector comprising:

a retention frame comprising a base portion defining a center opening and four sidewalls extending upwardly from the base portion;

a socket received in the opening of the base portion and comprising at least two interleaved socket units each carrying a set of contacts to engage contacts of an IC and positioned within the retention frame such that the base portion of the frame surround the socket and such that edges carried by the socket are positioned opposite to edges carried by the base portion; and set of contacts carried by each of the socket units and each comprising contact portions exposed beyond the sockets units, the contacting sections of said at least two socket units extending in opposite direction, wherein the socket forms a plurality of positioning posts on the edges thereof, and wherein the retention frame defines a plurality of positioning holes adjacent to the opening receive the positioning posts of the socket, wherein the positioning holes of the retention frame define through the base portion along vertical direction, and wherein the positioning posts of the socket depending downwardly from outer periphery of the socket, wherein each positioning post occupies the positioning hole with free end extending beyond the lower surface of the base portion of the retention frame a certain distance, and wherein the free end of each positioning post is formed to have a diameter larger than that of the positioning hole, wherein the each one of the socket units forms a plurality of spaced apart body sections coplanar outwardly extending from the upper surface thereof, and wherein each positioning post extends downwardly from the body section, wherein the base portion defines a plurality of spaced apart cutouts communicate with corresponding positioning holes and that receive the body sections that of the socket.

2. The Land Grid Array connector as claimed in claim 1, wherein upper surface of the socket is substantially coplanar with that of the base portion and upper contacting sections of the contacts are exposed in a receiving space formed by the base portion, the socket and the sidewalls of the retention frame adapted far receiving said IC.

3. The Land Grid Array connector as claimed in claim 2, wherein a lower surface of the socket is substantially coplanar with that of the base portion and lower contacting sections of the contacts are exposed beyond the lower surfaces of the socket and the base portion.

4. The Land Grid Array connector as claimed in claim 1, wherein the socket comprises a first socket unit and a second socket unit, and wherein the first and second socket units are combinable with each other and together assembled to the retention frame.

5. The Land Grid Array connector as claimed in claim 4, wherein the first socket unit forms a plurality of first protruding sections and a plurality of first aligning slots alternatively arranged on one edge thereof, and wherein the second socket unit forms a plurality of second aligning slots receiving the first protruding sections and a plurality of second protruding sections received in the first aligning slots on one edge thereof.

6. The Land Grid Array connector as claimed in claim 5, wherein the other three edges of the first and second socket units form a plurality of positioning posts, and wherein the base portion of the retention frame defines a plurality of positioning holes receiving the positioning posts.

7. The Land Grid Array connector as claimed in claim 1, wherein each contact comprises a contacting section with dual-beam structure.

* * * * *